(12) United States Patent
Shibata et al.

(10) Patent No.: US 7,319,061 B2
(45) Date of Patent: Jan. 15, 2008

(54) METHOD FOR FABRICATING ELECTRONIC DEVICE

(75) Inventors: Satoshi Shibata, Toyama (JP);
Fumitoshi Kawase, Toyama (JP);
Hisako Kamiyanagi, Toyama (JP); Emi Kanazaki, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/586,586

(22) Filed: Oct. 26, 2006

(65) Prior Publication Data

US 2007/0048918 A1     Mar. 1, 2007

Related U.S. Application Data

(62) Division of application No. 11/241,950, filed on Oct. 4, 2005.

(30) Foreign Application Priority Data

Oct. 7, 2004   (JP) .................... 2004-295132

(51) Int. Cl.
*H01L 21/336* (2006.01)
(52) U.S. Cl. ............ 438/300; 438/197; 438/289; 438/663; 257/E21.32; 257/E21.337; 257/E21.634; 257/E21.371
(58) Field of Classification Search ............ 438/300, 438/301, 311, 197, 149, 174, 194, 506, 514, 438/522, 663, 289
See application file for complete search history.

(56) References Cited

U.S. PATENT DOCUMENTS 6,297,115 B1 * 10/2001 Yu ...................... 438/305
6,429,083 B1 * 8/2002 Ishida et al. .............. 438/305
6,432,754 B1 * 8/2002 Assaderaghi et al. ....... 438/149
6,586,264 B2 * 7/2003 Usujima .................. 438/14
6,624,015 B2 * 9/2003 Patelmo et al. ........... 438/201
6,690,060 B2 * 2/2004 Horiuchi et al. ........... 257/327
6,878,599 B2 * 4/2005 Inaba ..................... 438/305
6,897,536 B2 * 5/2005 Nomura et al. ........... 257/403
2007/0048918 A1 * 3/2007 Shibata et al. ............ 438/197

FOREIGN PATENT DOCUMENTS

JP        58-197878        11/1983

* cited by examiner

*Primary Examiner*—David Nhu
(74) *Attorney, Agent, or Firm*—McDermott Will & Emery LLP

(57) ABSTRACT

In a method for fabricating an electronic device including a transistor with a drain extension structure, a correspondence between a size of a gate electrode of the transistor and ion implantation conditions or heat treatment conditions for forming the drain extension structure is previously obtained. This correspondence satisfies that the transistor has a given threshold voltage. After formation of the gate electrode and measurement of the size of the gate electrode, ion implantation conditions or heat treatment conditions for forming the drain extension structure are set based on the previously-obtained correspondence and the measured size of the gate electrode. Ion implantation or heat treatment for forming the drain extension structure is performed under the ion implantation conditions or heat treatment conditions that have been set.

1 Claim, 10 Drawing Sheets

EFFECTIVE CHANNEL LENGTH Leff

USUAL HEAT TREATMENT

EFFECTIVE CHANNEL LENGTH Leff

FIG. 9D    CHANGE HEAT TREATMENT CONDITIONS

EFFECTIVE CHANNEL LENGTH Leff

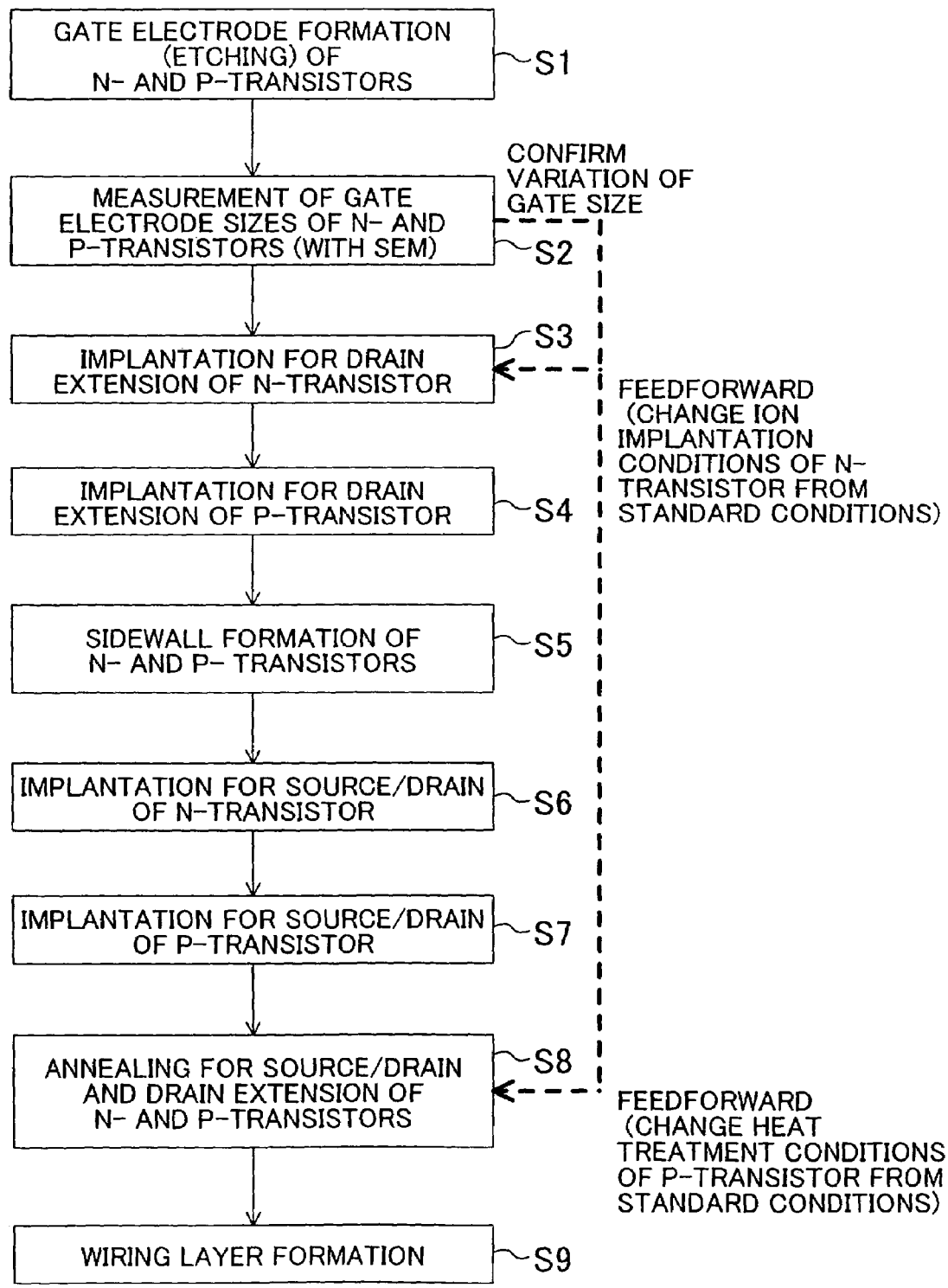

METHOD FOR FABRICATING ELECTRONIC DEVICE

RELATED APPLICATION

This application is a divisional of application Ser. No. 11/241,950, filed Oct. 4, 2005, which claims priority to 2004-295132, filed on Oct. 4, 2004; which are all incorporated herein by reference.

CROSS-REFERENCE TO RELATED APPLICATION

This application claims priority under 35 U.S.C. §119 on Patent Application No. 2004-295132 filed in Japan on Oct. 7, 2004, the entire contents of which are hereby incorporated by reference.

BACKGROUND OF THE INVENTION (1) Field of the Invention

The present invention relates to methods for fabricating electronic devices and especially to methods for fabricating electronic devices capable of controlling threshold voltages of transistors having drain extension structures with stability.

(2) Description of the Related Art

To enhance the function of electronic devices such as semiconductor integrated circuit devices, it has become essential to improve the performances of semiconductor devices forming the electronic devices. To achieve this, for MOS transistors that are often used as semiconductor elements at present, the size of gate electrodes has been reduced and semiconductor elements having gate-electrode sizes smaller than 100 nm are being manufactured.

To reduce the gate-electrode sizes to such a degree, techniques for processing gate electrodes have progressed rapidly. For example, lithography for transferring a pattern to a substrate allows the gate-electrode size to be controlled to 90 nm or less using an ArF excimer laser. In addition, the processing accuracy in dry etching for actually forming gate electrodes has been increasing.

However, these processing techniques utilize limitations of their associated physical phenomena, so that control of these phenomena has become more and more difficult. Accordingly, in mass production of devices, variations among devices, lots and, to the worst, wafers occur, and the variation range in characteristics of semiconductor elements depending on the accuracy in processing gate electrodes are disadvantageously the same as the range of specifications of non-defective products under current circumstances.

To correct such variations, feedback techniques in which results of performance inspection performed on elements before shipment of products are reflected in conditions for fabricating the products and feedforward techniques in which variations in performance of final elements are predicted from variations in a given fabrication process step of a product and results of this prediction are reflected in fabrication conditions in a subsequent process step have been proposed to date (see, for example, Japanese Unexamined Patent Publication No. 58-197878).

Specifically, a conventional feedforward technique is performed in the following manner. After a gate electrode has been formed through lighography and etching, the size of this gate electrode is measured. Then, the measured size of the gate electrode is compared with a predetermined reference value so as to obtain a deviation from an intended size of the gate electrode. Thereafter, the obtained deviation is applied to a database so that conditions of annealing for activating source/drain (S/D) are modified. This allows characteristics of element performance to be corrected. Subsequently, a wiring process is performed.

In this conventional technique, if a deviation of the gate-electrode size is detected, a feedforward process of, for example, modifying the annealing temperature for activating source/drain from a standard condition is performed such that an electrical and effective gate length Leff is equal to a length Leff obtained when the gate-electrode size has a design. value.

SUMMARY OF THE INVENTION

However, with miniaturization of semiconductor integrated circuit devices, a transistor structure including only source/drain regions formed by implanting a high concentration of impurity ions has been replaced by a transistor structure including source/drain regions and a drain extension region so as to suppress a short-channel effect. The drain extension region is a doped region formed between each of the source/drain regions and a channel region directly under a gate electrode and has an impurity concentration lower than that in the source/drain regions and higher than that in a lightly-doped drain (LDD) layer. Specifically, the impurity concentration in the drain extension region is about $10^{18}$ to $10^{19}$ atoms/cm$^3$. This drain extension region is formed by ion implantation at a dose of about $5\times10^{13}$ to $5\times10^{14}$ atoms/cm$^2$.

In a miniaturized transistor having such a drain extension structure, the effective channel length is determined as the distance between drain extension regions sandwiching a channel region.

The miniaturized transistor having the drain extension structure, however, exhibits an extremely complicated impurity distribution in which impurity distributions in the channel region, the drain extension regions and the source/drain regions are mixed, so that element performance characteristics such as the effective channel length resulting from a modification to annealing conditions greatly change. Accordingly, it is extremely difficult to apply the conventional feedforward technique to formation of a miniaturized transistor having a drain extension structure.

In addition, with increase in the number of functions of a device, it has become necessary to provide a plurality of semiconductor elements having different functions together, e.g., to provide a p-channel transistor (hereinafter, referred to as a p-transistor) and an n-channel transistor (hereinafter, referred to as an n-transistor) in a semiconductor integrated circuit device. In such a structure, boron diffusing at a relatively high speed is used as an impurity to be implanted in drain extension regions of the p-transistor and phosphorus or arsenic diffusing at a low speed is used as an impurity to be implanted in drain extension regions of the n-transistor. Accordingly, the variation rates of element characteristics resulting from modifications to annealing conditions differ between the p-transistor and the n-transistor. Accordingly, the conventional feedforward process performed only on an annealing process for activating source/drain has a drawback in which only one of the p-transistor and the n-transistor obtains desired characteristics.

It is therefore an object of the present invention to provide a method for fabricating an electronic device capable of suppressing variation of element characteristics caused by size variation of a gate electrode of a semiconductor element with a drain extension structure.

In order to achieve this object, the present inventors came up with the idea of a feedforward technique in which an influence of variation of a gate-electrode size on characteristics of a semiconductor element with a drain extension structure is compensated by controlling the distance between drain extension regions sandwiching a channel region.

Specifically, a first method for fabricating an electronic device according to the present invention is a method for fabricating an electronic device including a transistor with a drain extension structure. The method includes the steps of: previously obtaining a correspondence between a size of a gate electrode of the transistor and ion implantation conditions for forming the drain extension structure, the correspondence satisfying that a threshold voltage of the transistor is at a given level; forming the gate electrode; measuring the size of the gate electrode; setting ion implantation conditions for forming the drain extension structure, based on the previously-obtained correspondence and the measured size of the gate electrode; and performing ion implantation for forming the drain extension structure under the ion implantation conditions that have been set.

That is, in the first method, after formation of a gate electrode, the size of the gate electrode is measured, and then a feedforward process of making the measurement result of the gate-electrode size reflected in ion implantation conditions for forming a drain extension structure is performed so as to obtain a desired threshold voltage, i.e., a desired effective channel length, of the resultant transistor. Specifically, implantation energy, implantation dose or implantation angle, for example, is changed from a standard condition based on an expected variation rate of the effective channel length calculated from the measurement result of the gate-electrode size.

A second method for fabricating an electronic device according to the present invention is a method for fabricating an electronic device including a transistor with a drain extension structure. The method includes the steps of: previously obtaining a correspondence between a size of a gate electrode of the transistor and heat treatment conditions for forming the drain extension structure, the correspondence satisfying that a threshold voltage of the transistor is at a given level; forming the gate electrode; measuring the size of the gate electrode; performing ion implantation for forming the drain extension structure; setting heat treatment conditions for forming the drain extension structure, based on the previously-obtained correspondence and the measured size of the gate electrode; and performing heat treatment for forming the drain extension structure under the heat treatment conditions that have been set, after the step of performing the ion implantation.

That is, in the second method, after formation of a gate electrode, the size of the gate electrode is measured, and then a feedforward process of making the measurement result of the gate-electrode size reflected in heat treatment (activation annealing) conditions for forming a drain extension structure is performed so as to obtain a desired threshold voltage, i.e., a desired effective channel length, of the resultant transistor. Specifically, conditions of activation annealing, especially S/D activation annealing performed at the highest temperature for the longest time in fabrication processes and carried out after ion implantation for forming a drain extension structure, are changed from standard conditions based on an expected variation rate of the effective channel length calculated from the measurement result of the gate-electrode size.

In the second method, the measurement result of the gate-electrode size is reflected in the annealing time, so that a drain extension structure is accurately formed. Specifically, as an annealing technique for forming a shallow junction, a short-time annealing technique with an annealing time of one minute or less has been conventionally used. Within such a short annealing time, a processed wafer cannot reach a complete thermal equilibrium state, and therefore it is extremely difficult to measure the temperature of the processed wafer. Accordingly, it is difficult to make the measurement result of the gate-electrode size reflected in the annealing temperature. On the other hand, a feedforward process of making the result reflected in the annealing time, which is more easily measured than the annealing temperature, is very effective in implementing the second method of the present invention.

In this case, in the heat treatment for forming the drain extension structure, annealing apparatus capable of controlling the annealing time with a precision of one second or less is preferably used.

Specifically, with cold-wall annealing apparatus typified by lamp annealing apparatus that rapidly heats a wafer by turning on a lamp and rapidly cools the wafer by turning off the lamp, the wafer is not readily cooled because of residual heat remaining on a wall near the wafer after turning off the lamp, so that it is difficult to control the annealing time. On the other hand, with annealing apparatus capable of controlling the annealing time with a precision of one second or less, e.g., hot-wall short-time annealing apparatus, the wafer temperature is rapidly raised by moving the wafer into a wall atmosphere at a temperature higher than a desired temperature and the wafer temperature is rapidly reduced by moving the wafer into a wall atmosphere at a temperature lower than the desired temperature. Accordingly, the annealing time is easily controlled. That is, short-time annealing apparatus is very effective in implementing the present invention.

A third method for fabricating an electronic device according to the present invention is a method for fabricating an electronic device including a transistor with a drain extension structure. The method includes the steps of: previously obtaining a first correspondence between a size of a gate electrode of the transistor and ion implantation conditions for forming the drain extension structure, the first correspondence satisfying that a threshold voltage of the transistor is at a given level; previously obtaining a second correspondence between the size of the gate electrode and heat treatment conditions for forming the drain extension structure, the second correspondence satisfying that the threshold voltage is at the given level; forming the gate electrode; measuring the size of the gate electrode; setting ion implantation conditions for forming the drain extension structure, based on the previously-obtained first correspondence and the measured size of the gate electrode; performing ion implantation for forming the drain extension structure under the ion implantation conditions that have been set; setting heat treatment conditions for forming the drain extension structure, based on the previously-obtained second correspondence and the measured size of the gate electrode; and performing heat treatment for forming the drain extension structure under the heat treatment conditions that have been set, after the step of performing the ion implantation.

That is, as in the first and second methods, in the third method, a feedforward process of making the measurement result of a gate-electrode size reflected in ion implantation conditions and heat treatment conditions for forming a drain extension structure is performed.

A fourth method for fabricating an electronic device according to the present invention is a method for fabricating an electronic device including an n-transistor with a drain extension structure and a p-transistor with a drain extension structure. The method includes the steps of: previously obtaining a first correspondence between a size of a gate electrode of the n-transistor and ion implantation conditions for forming the drain extension structure of the n-transistor, the first correspondence satisfying that a threshold voltage of the n-transistor is at a given level; previously obtaining a second correspondence between a size of a gate electrode of the p-transistor and heat treatment conditions for forming the drain extension structure of the p-transistor, the second correlation satisfying that a threshold voltage of the p-transistor is at the given level; forming the gate electrodes of the respective n- and p-transistors; measuring the sizes of the gate electrodes of the respective n- and p-transistors; setting ion implantation conditions for forming the drain extension structure of the n-transistor, based on the previously-obtained first correspondence and the measured size of the gate electrode of the n-transistor; performing first ion implantation for forming the drain extension structure of the n-transistor under the ion implantation conditions that have been set; performing second ion implantation for forming the drain extension structure of the p-transistor; setting heat treatment conditions for forming the drain extension structure of the p-transistor, based on the previously-obtained second correspondence and the measured size of the gate electrode of the p-transistor; and performing heat treatment for forming the drain extension structures of the n- and p-transistors under the heat treatment conditions that have been set, after the steps of performing the first ion implantation and the second ion implantation.

That is, in the fourth method, a feedforward process of making the measurement result of the gate-electrode size reflected in ion implantation conditions for forming a drain extension structure for an n-transistor and making the measurement result reflected in annealing conditions for forming a drain extension structure for a p-transistor is performed.

According to the present invention, variation of characteristics of semiconductor elements with drain extension structures in a miniaturized electronic device is suppressed, irrespective of variation of gate-electrode sizes.

In addition, according to the present invention, not only in fabrication of an electronic device including only one of a p-transistor and an n-transistor, for example, but also in fabrication of an electronic device including a plurality of semiconductor elements having drain extension structures and different functions, e.g., including, for example, a p-transistor and an n-transistor, characteristics of semiconductor elements are stabilized, irrespective of variation of gate-electrode sizes.

As described above, the present invention relates to methods for fabricating electronic devices. The present invention is very useful in application to an electronic device including a semiconductor element with a drain extension structure. In this case, an advantage in which performance of the semiconductor element is stabilized irrespective of variation of processed gate-electrode sizes.

BRIEF DESCRIPTION OF THE DRAWINGS

FIGS. 9A through 9D are cross-sectional views illustrating respective process steps of a method for fabricating an electronic device according to the fourth embodiment.

FIG. 10 is a flowchart of a method for fabricating an electronic device according to the fifth embodiment.

DETAILED DESCRIPTION OF THE INVENTION

Embodiment 1

Hereinafter, a method for fabricating an electronic device according to a first embodiment of the present invention will be described with reference to the drawings.

Figure 1:
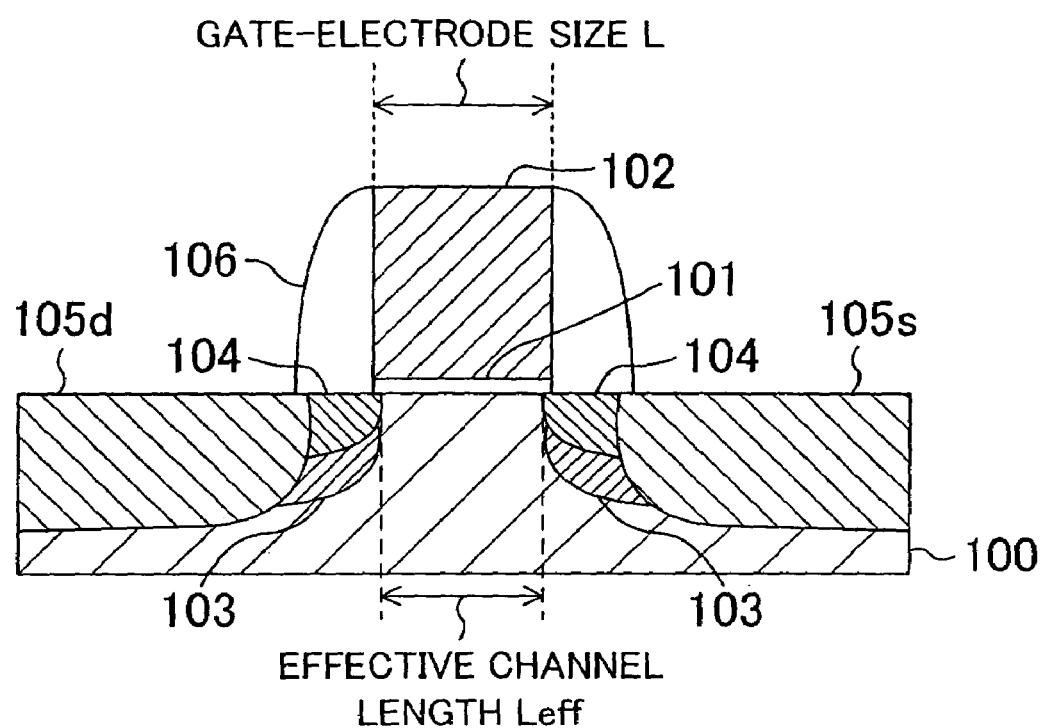
FIG. 1 is a cross-sectional view illustrating a structure of a MOS transistor with a drain extension structure in a device to which embodiments of the present invention are applied.

FIG. 1 is a cross-sectional view illustrating a structure of a metal oxide semiconductor (MOS) transistor with a drain extension structure in a device to which this embodiment is applied.

As illustrated in FIG. 1, a gate electrode 102 is formed over a p-type silicon substrate 100 with a gate oxide film 101 interposed therebetween. Sidewalls 106 made of, for example, a silicon oxide film are formed on the sides of the gate electrode 102. Drain extension regions 104 of an n-type are formed under the sidewalls 106 in the silicon substrate 100. Pocket regions 103 of a p-type for suppressing expansion of a depletion layer are formed directly under the drain extension regions 104 in the silicon substrate 100. N-type source/drain regions 105 (i.e., a source region 105s and a drain region 105d) are formed at both sides of the gate electrode 102 in the silicon substrate 100 and are in contact with the pocket regions 103 and the drain extension regions 104.

The gate electrode 102 of the transistor illustrated in FIG. 1 has a size of L (e.g., L=0.15 µm). The distance between the drain extension regions 104 sandwiching a channel region under the gate electrode 102 is an effective channel length Leff. This effective channel length Leff is a parameter for determining the threshold voltage of the transistor. Specifically, if the effective channel length Leff is smaller than a design length, the threshold voltage is low, whereas if the effective channel length Leff is larger than the design length, the threshold voltage is high.

Figure 2A:
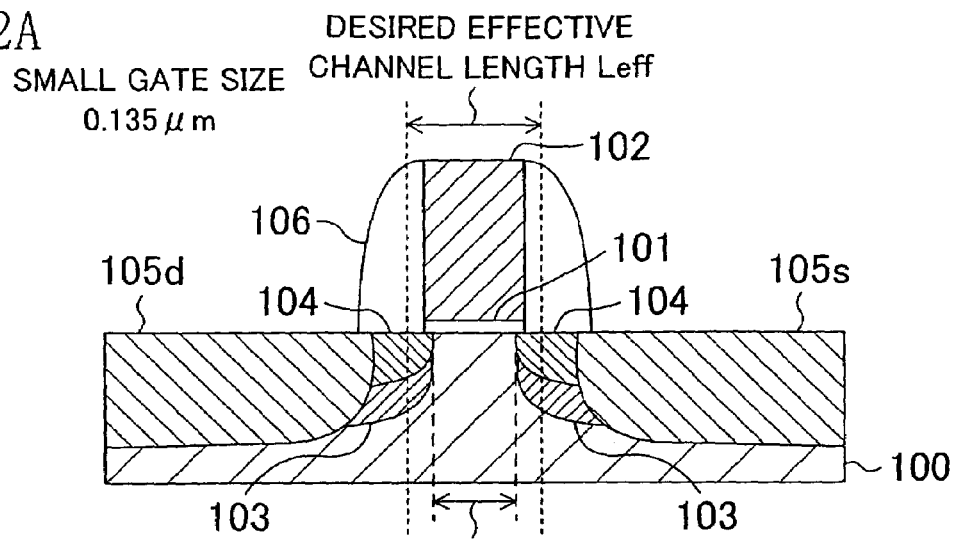
FIGS. 2A through 2C are cross-sectional views illustrating variation of the size (i.e., the gate length) of a gate electrode in the transistor illustrated in FIG. 1.
Figure 2B:
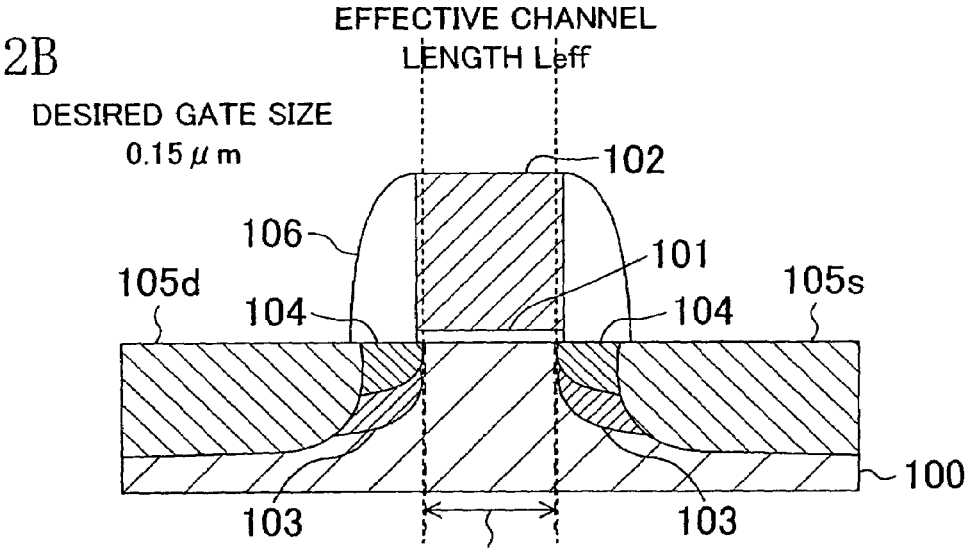
Figure 2C:
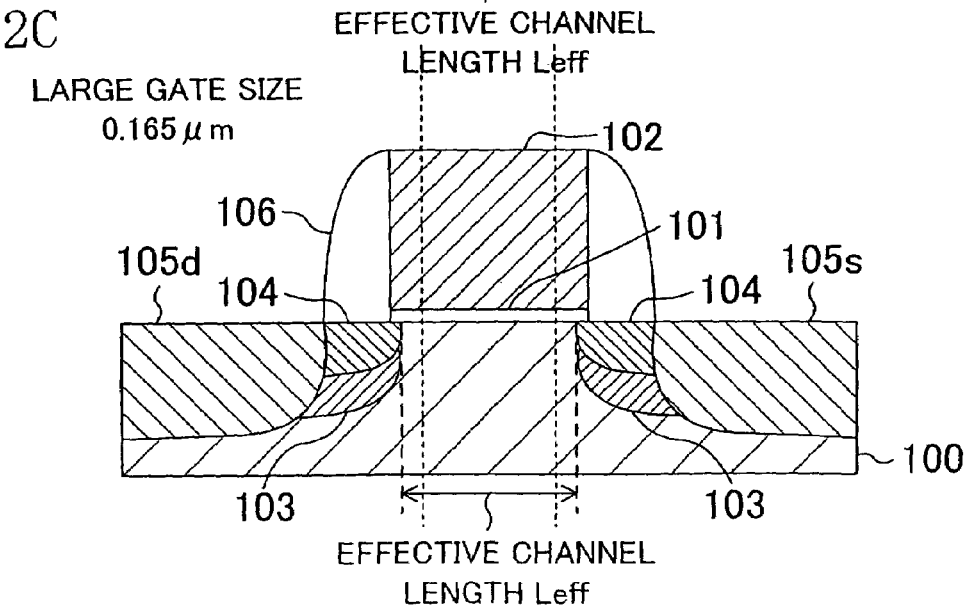

FIGS. 2A through 2C are cross-sectional views illustrating variation of the size (i.e., the gate length) of the gate electrode 102 in the transistor illustrated in FIG. 1. Specifically, a design gate length (i.e., an intended gate size) is assumed to be 0.15 µm, and the actual processed size of the gate electrode 102 varies because of etching. FIG. 2A shows a case where the processed size of the gate electrode 102 is smaller than the design size, which is 0.135 µm. FIG. 2B shows a case where the processed size of the gate electrode 102 is equal to the design size. FIG. 2C shows a case where the processed size of the gate electrode 102 is larger than the design size because of etching. The processed size in FIG. 2C is 0.165 µm. Each of the gate-electrode sizes shown in FIGS. 2A through 2C is an average value in a wafer. In mass production of devices, the gate-electrode size varies even among devices of the same type. Even in manufacturing devices of the same type under the same etching conditions, the gate-electrode size can vary among lots.

According to the present invention, a feedforward process is performed such that the measurement result of the gate-electrode size is reflected in a process (specifically, an ion implantation process for forming extensions or an annealing process after the ion implantation process) after processing of a gate electrode so as to prevent variation of threshold voltages of transistors even if processed sizes of gate electrodes vary as illustrated in FIGS. 2A and 2C.

Hereinafter, prior to description of a feedforward technique, which is a feature of this embodiment, a method for fabricating a MOS transistor under standard conditions will be described with reference to FIGS. 3A through 3E with an nMOS transistor taken as an example.

Figure 3A:
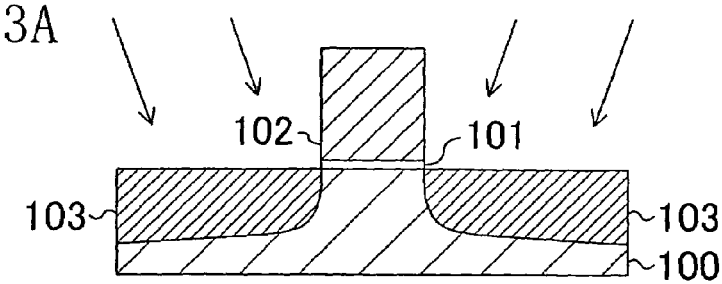
FIGS. 3A through 3E are cross-sectional views illustrating respective process steps of a method for fabricating a MOS transistor under standard conditions as a comparison with methods for fabricating electronic devices according to first through fifth embodiments of the present invention.

First, as illustrated in FIG. 3A, a gate oxide film 101 is formed on a p-type silicon substrate 100, and then a gate electrode 102 (with a size of 0.15 µm) is formed on the gate oxide film 101. Subsequently, ions of, for example, boron are implanted in the silicon substrate 100 using the gate electrode 102 as a mask, thereby forming p-type pocket regions 103. In this case, boron is implanted at an angle (a tilt angle with respect to the normal to the principal surface of the substrate; the same hereinafter) of, for example, 7 degrees.

Figure 3B:
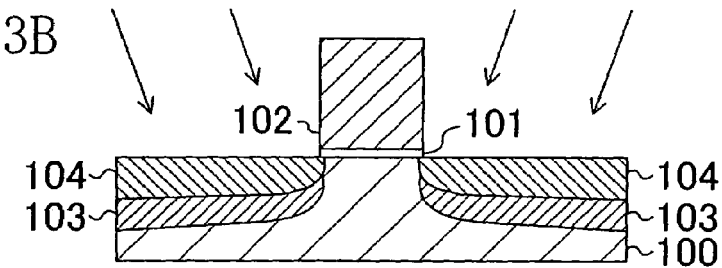

Next, as illustrated in FIG. 3B, ions of, for example, arsenic are implanted in the silicon substrate 100 using the gate electrode 102 as a mask, thereby forming n-type drain extension regions 104 on the pocket regions 103. In this case, arsenic is implanted at an angle of, for example, 7 degrees with an energy of, for example, 6 keV at a dose of, for example, $5 \times 10^{14}$ atoms/cm$^2$.

Figure 3C:
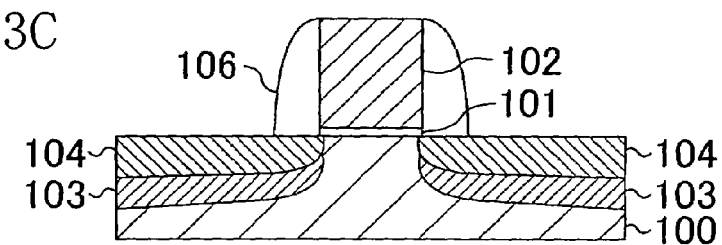
Figure 3D:
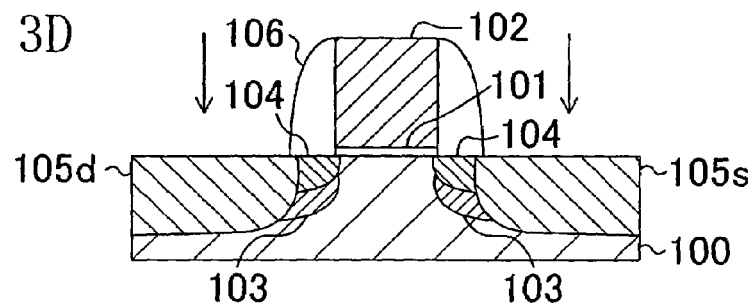

Then, as illustrated in FIG. 3C, sidewalls 106 made of, for example, a silicon oxide film are formed on the sides of the gate electrode 102. Thereafter, as illustrated in FIG. 3D, ions of, for example, arsenic are implanted in the silicon substrate 100 using the gate electrode 102 and the sidewalls 106 as masks, thereby forming source/drain regions 105 (i.e., a source region 105s and a drain region 105d). In this case, arsenic is implanted at an angle of, for example, zero degrees (with no tilt) with an energy of, for example, 50 keV at a dose of, for example, $5 \times 10^{15}$ atoms/cm$^2$. In this manner, a structure in which the stack of the pocket regions 103 and the drain extension regions 104 is interposed between the channel region under the gate electrode 102 and the source/drain regions 105 is formed.

Figure 3E:
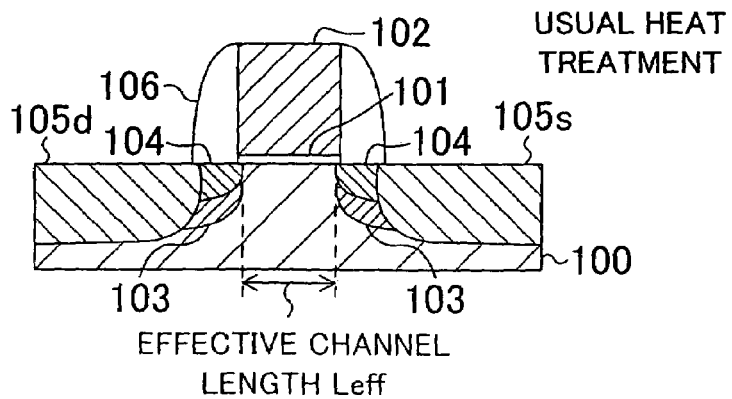

Lastly, as illustrated in FIG. 3E, heat treatment is performed so as to diffuse and activate the impurities implanted in the drain extension regions 104 and the source/drain regions 105. In this case, the heat treatment is performed at a temperature of, for example, 1020° C. for, for example, 6.5 seconds. In this manner, an nMOS transistor is formed.

The foregoing description has been given on the method for fabricating an nMOS transistor with reference to FIGS. 3A through 3E. A method for fabricating a pMOS transistor under standard conditions is similar to that method. Specifically, in a pMOS transistor provided on an n-type silicon substrate 100, pocket regions 103 are of an n-type, so that ions of, for example, arsenic are implanted in the silicon substrate 100 at an angle of 7 degrees in order to form these pocket regions. Since drain extension regions 104 are of a p-type in this pMOS transistor, ions of, for example, boron are implanted in the silicon substrate 100 with an energy of 0.8 keV at an angle of 7 degrees at a dose of $5 \times 10^{14}$ atoms/cm$^2$ in order to form these extension regions. Since source/drain regions 105 are of a p-type, ions of, for example, boron are implanted in the silicon substrate 100 with an energy of 5 keV at an angle of zero degrees (with no tilt) at a dose of $5 \times 10^{15}$ atoms/cm$^2$ in order to form these source/drain regions. Heat treatment for diffusing and activating the impurities implanted in the drain extension regions 104 and the source/drain regions 105 is performed at a temperature of 1020° C. for 6.5 seconds, as in the method for fabricating an nMOS transistor.

Now, a feedforward technique (i.e., a technique of making the measurement result of a gate-electrode size reflected in process conditions) of this embodiment in a case where the gate-electrode size varies, specifically in a case where the size of a gate electrode formed by etching polysilicon is smaller than a design value; will be described, using the process steps illustrated in FIG. 3A through 3E as reference processes. In this embodiment, it is assumed that the design value of the gate-electrode size is 0.15 µm and the processed size of the gate electrode is smaller than the design value by 10%, i.e., is 0.135 µm.

Figure 4A:
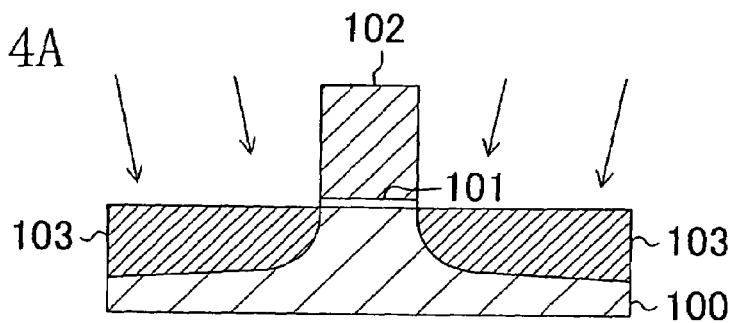
FIGS. 4A through 4D are cross-sectional views illustrating respective process steps of a method for fabricating an electronic device according to the first embodiment.
Figure 4B:
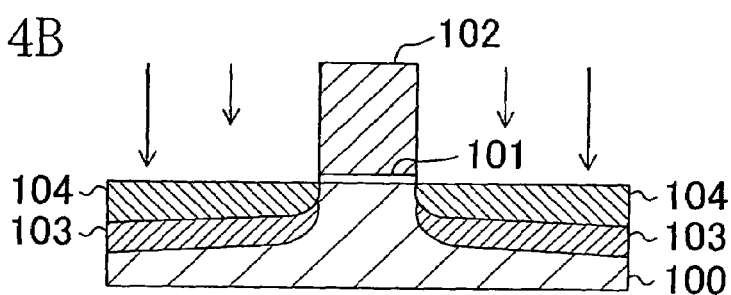
Figure 4C:
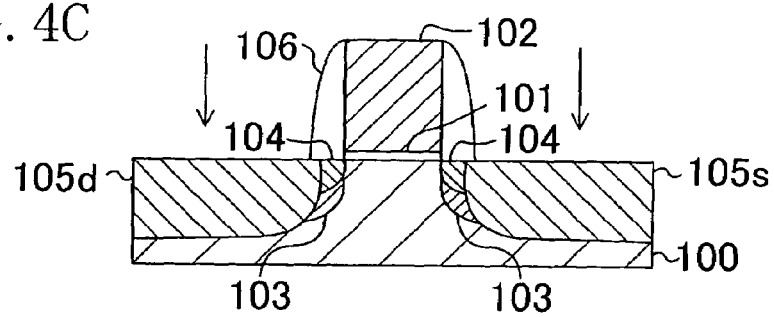
Figure 4D:
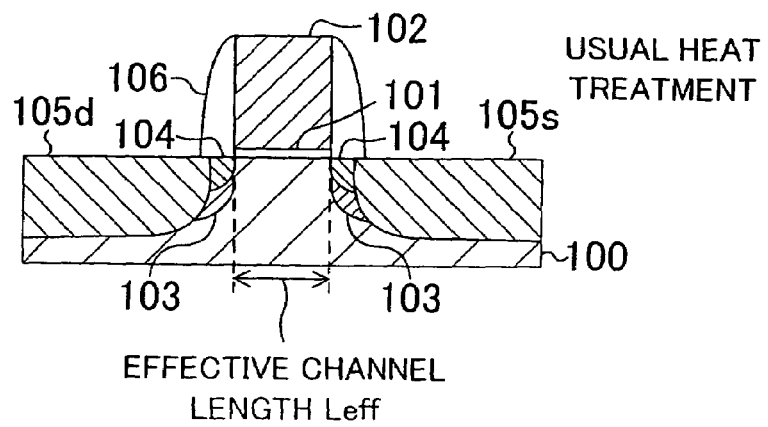

FIGS. 4A and 4D are cross-sectional views illustrating process steps of a method for fabricating an electronic device according to this embodiment.

First, as illustrated in FIG. 4A, a gate oxide film 101 is formed on a p-type silicon substrate 100. Then, a gate electrode 102 made of, for example, polysilicon is formed on the gate oxide film 101 using a known lithography process and a known etching process. Thereafter, the size (i.e., the gate length) of the gate electrode 102 is measured with a scanning electron microscope (SEM). In -this case, the measured value of the gate-electrode size is 0.135 µm, whereas the design value of the gate-electrode size is 0.15 µm. Subsequently, ions of, for example, boron are implanted in the silicon substrate 100 using the gate electrode 102 as a mask, thereby forming p-type pocket regions 103. In this case, boron is implanted at an angle of, for example, 7 degrees.

Next, as illustrated in FIG. 4B, ions of, for example, arsenic are implanted in the silicon substrate 100 using the gate electrode 102 as a mask, thereby forming n-type drain extension regions 104 on the pocket regions 103. In this case, arsenic is implanted at an angle of, for example, zero degrees (with no tilt) with an energy of, for example, 6 keV at a dose of, for example, $5 \times 10^{14}$ atoms/cm$^2$. That is, in this embodiment, since the processed size of the gate electrode 102 is smaller than the design value, the implantation angle of arsenic is changed from 7 degrees, which is the standard condition of the reference processes described above, to zero degrees. In this embodiment, conditions for this ion implantation are set in the following manner. That is, a correspondence between the size of the gate electrode 102 and ion implantation conditions is obtained beforehand. This correspondence satisfies that the resultant transistor has a given threshold voltage (or an effective channel length Leff, i.e., the distance between the drain extension regions 104 sandwiching a channel region under the gate electrode 102, determining the threshold voltage). Then, ion implantation conditions are set based on this correspondence and the measured size of the gate electrode 102.

Then, as illustrated in FIG. 4C, sidewalls 106 made of, for example, a silicon oxide film are formed on the sides of the gate electrode 102. Thereafter, ions of, for example, arsenic are implanted in the silicon substrate 100 using the gate electrode 102 and the sidewalls 106 as masks, thereby forming source/drain regions 105 (i.e., a source region 105s and a drain region 105d). In this case, arsenic is implanted at an angle of, for example, zero degrees (with no tilt) with an energy of, for example, 50 keV at a dose of, for example, $5 \times 10^{15}$ atoms/cm². That is, conditions of the ion implantation for forming the source/drain regions 105 are the same as the standard conditions of the reference processes for forming an n-transistor described above. In this manner, a structure in which the stack of the pocket regions 103 and the drain extension regions 104 is interposed between the channel region under the gate electrode 102 and the source/drain regions 105 is formed.

Lastly, as illustrated in FIG. 4D, heat treatment is performed so as to diffuse and activate the impurities implanted in the drain extension regions 104 and the source/drain regions 105. In this case, the heat treatment is performed at a temperature of, for example, 1020° C. for, for example, 6.5 seconds. That is, conditions of this heat treatment are the same as the standard conditions of the reference processes for forming an n-transistor described above. In this manner, an nMOS transistor is formed.

In this embodiment, in view of the fact that the processed size of the gate electrode 102 is smaller than the design value, the angle of ion implantation for forming the drain extension regions 104 is set smaller than the standard condition. This makes the drain extension regions 104 expand under the gate electrode 102 to a small degree, so that the effective channel length Leff of the transistor approaches the design value. Accordingly, variation of threshold voltages of transistors is suppressed. In other words, transistors having a desired threshold voltage are obtained.

In this embodiment, the angle of ion implantation for forming the extension is controlled. Alternatively, the "ion implantation energy" or the "ion implantation amount (i.e., dose)" for forming the extension may be adjusted. That is, even in such cases, it is possible to suppress expansion of the impurity implanted in the drain extension regions 104 to the channel region, so that the effective channel length Leff is controlled. Specifically, if the gate-electrode size is smaller than the design value, the ion implantation energy for forming the extension is set lower than the standard condition, whereas if the gate-length size is larger than the design value, the ion implantation energy for forming the extension is set higher than the standard condition. In the same manner, if the gate-electrode size is smaller than the design value, the implantation dose for forming the extension is set smaller than the standard condition, whereas if the gate-electrode size is larger than the design value, the implantation dose for forming the extension is set larger than the standard condition.

In this embodiment, with respect to variation of the gate-electrode size, two or more of the "implantation angle", the "implantation energy" and the "implantation dose" for forming the extension may be adjusted. Instead of adjustment of ion implantation conditions for forming the extension or in addition to this adjustment, with respect to variation of the gate-electrode size, conditions (e.g., temperature and time) of heat treatment (i.e., the process step illustrated in FIG. 4D) for forming the extension may be adjusted. In such a case, conditions of this heat treatment are set in the following manner. That is, a correspondence between the size of the gate electrode 102 and heat treatment conditions is obtained beforehand. This correspondence satisfies that the resultant transistor has a given threshold voltage (or a given effective channel length Leff, i.e., the distance between the drain extension regions 104 sandwiching a channel region under the gate electrode 102, determining the threshold voltage). Then, heat treatment conditions are set based on this correspondence and the measured size of the gate electrode 102.

In this embodiment, in measuring the size of the gate electrode 102, the size of the gate electrode 102 made of a polysilicon film actually patterned by etching is measured with an SEM. Alternatively, the size of a gate-electrode resist pattern (or a gate-electrode hard mask formed using the resist pattern) formed by lithography before an etching process for processing the gate electrode may be measured as the size of the gate electrode.

Embodiment 2

Hereinafter, a method for fabricating an electronic device according to a second embodiment of the present invention will be described with reference to the drawings. In this embodiment, a feedforward technique (i.e., a technique of making the measurement result of a gate-electrode size reflected in process conditions) in a case where the gate-electrode size varies, specifically in a case where the size of a gate electrode formed by etching polysilicon is smaller than a design value, will be described, using the process steps illustrated in FIGS. 3A through 3E as reference processes. Specifically, in this embodiment, it is assumed that the design value of the gate-electrode size is 0.15 μm and the processed size of the gate electrode is smaller than the design value by 10%, i.e., is 0.135 μm.

Figure 5A:
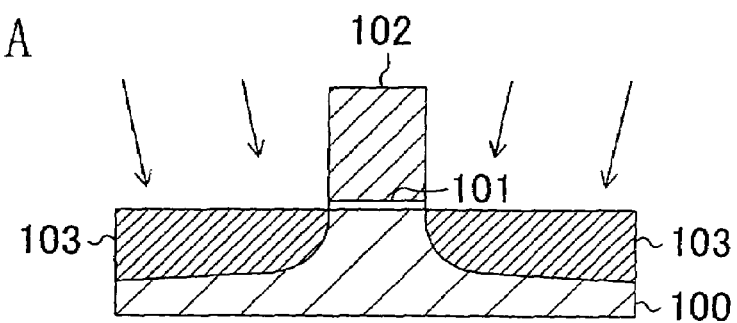
FIGS. 5A through 5D are cross-sectional views illustrating respective process steps of a method for fabricating an electronic device according to the second embodiment.
Figure 5B:
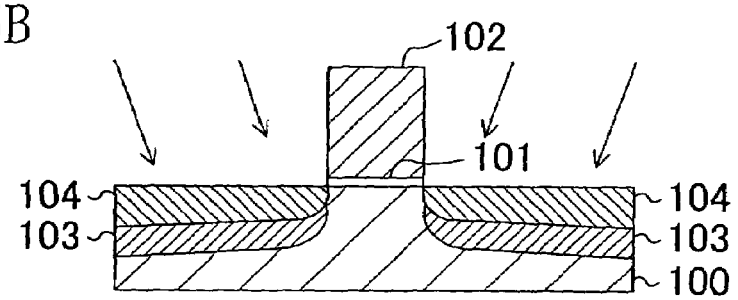
Figure 5C:
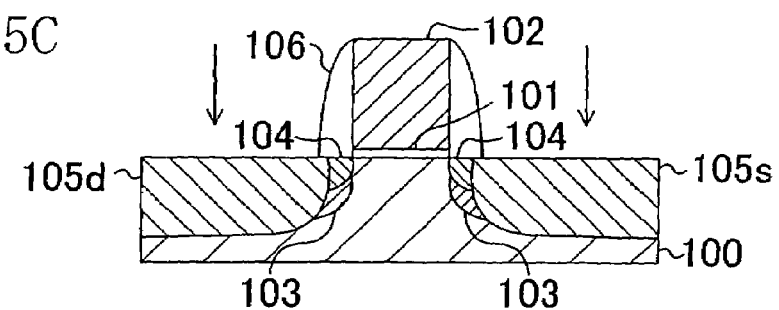
Figure 5D:
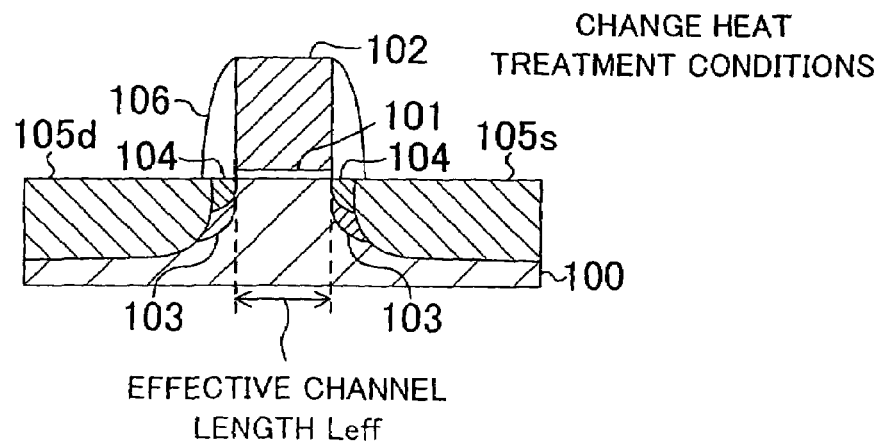

FIGS. 5A and 5D are cross-sectional views illustrating process steps of a method for fabricating an electronic device according to this embodiment.

First, as illustrated in FIG. 5A, a gate oxide film 101 is formed on an n-type silicon substrate 100. Then, a gate electrode 102 made of, for example, polysilicon is formed on the gate oxide film 101 using a known lithography process and a known etching process. Thereafter, the size (i.e., the gate length) of the gate electrode 102 is measured with an SEM. In this case, the measured value of the gate-electrode size is 0.135 μm, whereas the design value of the gate-electrode size is 0.15 μm. Subsequently, ions of, for example, arsenic are implanted in the silicon substrate 100 using the gate electrode 102 as a mask, thereby forming n-type pocket regions 103. In this case, arsenic is implanted at an angle of, for example, 7 degrees.

Next, as illustrated in FIG. 5B, ions of, for example, boron are implanted in the silicon substrate 100 using the gate electrode 102 as a mask, thereby forming p-type drain extension regions 104 on the pocket regions 103. In this case, boron is implanted at an angle of, for example, 7 degrees with an energy of, for example, 0.8 keV at a dose of, for example, $5 \times 10^{14}$ atoms/cm². That is, conditions for the ion implantation for forming the drain extension regions 104 are the same as the standard conditions of the reference processes for forming a p-transistor described above.

Then, as illustrated in FIG. 5C, sidewalls 106 made of, for example, a silicon oxide film are formed on the sides of the gate electrode 102. Thereafter, ions of, for example, boron are implanted in the silicon substrate 100 using the gate electrode 102 and the sidewalls 106 as masks, thereby forming source/drain regions 105 (i.e., a source region 105s and a drain region 105d). In this case, boron is implanted at an angle of, for example, zero degrees (with no tilt) with an energy of, for example, 5 keV at a dose of, for example, $5 \times 10^{15}$ atoms/cm$^2$. That is, conditions of the ion implantation for forming the source/drain regions 105 are the same as the standard conditions of the reference processes for forming a p-transistor described above.

Lastly, as illustrated in FIG. 5D, heat treatment is performed so as to diffuse and activate the impurities implanted in the drain extension regions 104 and the source/drain regions 105. In this case, the heat treatment is performed at a temperature of, for example, 1020° C. for, for example, 4.5 seconds. That is, in this embodiment, since the processed size of the gate electrode 102 is smaller than the design value, the heat treatment time is changed from 6.5 seconds, which is the standard condition of the reference processes, to 4.5 seconds. In this manner, a pMOS transistor is formed. In this embodiment, conditions of this heat treatment are set in the following manner. That is, a correspondence between the size of the gate electrode 102 and heat treatment conditions is obtained beforehand. This correspondence satisfies that the transistor has a given threshold voltage (or a given effective channel length Leff, i.e., the distance between the drain extension regions 104 sandwiching a channel region under the gate electrode 102, determining the threshold voltage). Then, heat treatment conditions are set based on this correspondence and the measured size of the gate electrode 102.

In this embodiment, in view of the fact that the processed size of the gate electrode 102 is smaller than the design value, the heat treatment time for forming the drain extension regions 104 is set shorter than the standard condition. This makes the drain extension regions 104 expand under the gate electrode 102 to a small degree, so that the effective channel length Leff of the transistor approaches the design value. Accordingly, variation of threshold voltages of transistors is suppressed. In other words, transistors having a desired threshold voltage are obtained.

That is, in this embodiment, a feedforward process of making the measurement result of the gate-electrode size reflected in the heat treatment (annealing) time is performed, so that a drain extension structure is accurately formed. Specifically, as an annealing technique for forming a shallow junction, a short-time annealing technique with an annealing time of one minute or less has been conventionally used. Within such a short annealing time, a processed wafer cannot reach a complete thermal equilibrium state, and therefore it is extremely difficult to measure the temperature of the processed wafer. Accordingly, it is difficult to make the measurement result of the gate-electrode size reflected in the annealing temperature. On the other hand, a feedforward process of making the result reflected in the annealing time, which is more easily measured than the annealing temperature, is very effective in implementing the present invention.

In this embodiment, in the heat treatment (i.e., the process step illustrated in FIG. 5D) for forming the drain extension structure, annealing apparatus capable of controlling the annealing time with a precision of one second or less is preferably used. Specifically, with cold-wall annealing apparatus typified by lamp annealing apparatus that rapidly heats a wafer by turning on a lamp and rapidly cools the wafer by turning off the lamp, the wafer is not readily cooled because of residual heat remaining on a wall near the wafer after turning off the lamp, so that it is difficult to control the annealing time. On the other hand, with annealing apparatus capable of controlling the annealing time with a precision of one second or less, e.g., hot-wall short-time annealing apparatus, the wafer temperature is rapidly raised by moving the wafer into a wall atmosphere at a temperature higher than a desired temperature and the wafer temperature is rapidly reduced by moving the wafer into a wall atmosphere at a temperature lower than the desired temperature. Accordingly, the annealing time is easily controlled. That is, short-time annealing apparatus is very effective in implementing the present invention.

In this embodiment, the heat treatment time for forming the extension is controlled. Alternatively, the temperature of the heat treatment for forming the extension may be adjusted. That is, in this case, it is also possible to suppress expansion of the impurity implanted in the drain extension regions 104 toward the channel region, so that the effective channel length Leff is controlled. Specifically, in the heat treatment process illustrated in FIG. 5D of this embodiment, for example, the heat treatment time is set at 6.5 seconds, which is the standard condition of the reference processes, and the heat treatment temperature is set at 1015° C., which is lower than the standard condition, so that the effective channel length Leff of the transistor approaches the design value. That is, if the gate-electrode size is smaller than the design value, the heat treatment temperature for forming the extension is set lower than the standard condition, whereas if the gate-electrode size is larger than the design value, the heat treatment temperature for forming the extension is set higher than the standard condition.

In this embodiment, with respect to variation of the gate-electrode size, both of the "heat treatment time" and the "heat treatment temperature" for forming the extension may be adjusted. With respect to variation of the gate-electrode size, instead of the adjustment of the heat treatment conditions for forming the extension, or in addition to the adjustment, conditions (e.g., implantation angle, implantation energy and implantation dose) of ion implantation (i.e., the process step illustrated in FIG. 5B) for forming the extension may be adjusted. In such a case, the ion implantation conditions are set in the following manner. That is, a correspondence between the size of the gate electrode 102 and ion implantation conditions is obtained beforehand. This correspondence satisfies that the resultant transistor has a given threshold voltage (or a given effective channel length Leff, i.e., the distance between the drain extension regions 104 sandwiching a channel region under the gate electrode 102, determining the threshold voltage). Then, ion implantation conditions are set based on this correspondence and the measured size of the gate electrode 102.

In this embodiment, in measuring the size of the gate electrode 102, the size of the gate electrode 102 made of a polysilicon film actually patterned by etching is measured with an SEM. Alternatively, the size of a gate-electrode resist pattern (or a gate-electrode hard mask formed using the resist pattern) formed by lithography before an etching process for processing the gate electrode may be measured as the size of the gate electrode.

Hereinafter, a specific example of a feedforward process of making a measurement result of a gate-electrode size reflected in the annealing time according to this embodiment will be described.

Figure 6A:
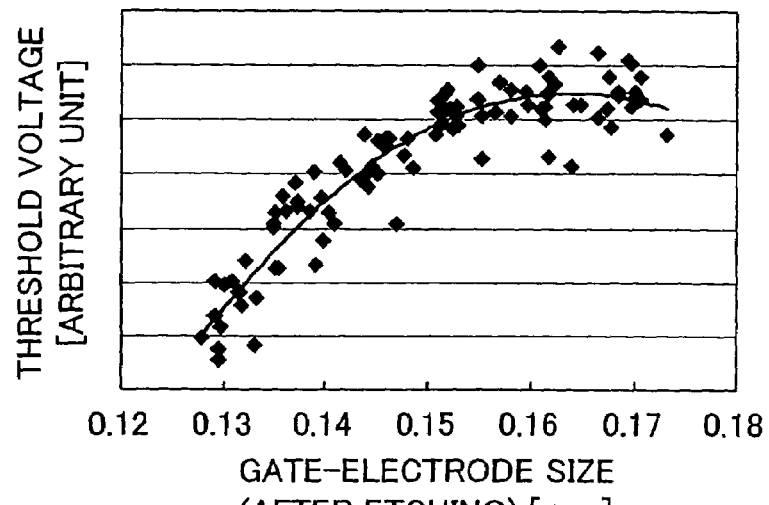
FIGS. 6A through 6C are graphs for explaining a feedforward method of making the measurement result of the gate-electrode size reflected in annealing time in the method for fabricating an electronic device of the second or fourth embodiment.
Figure 6B:
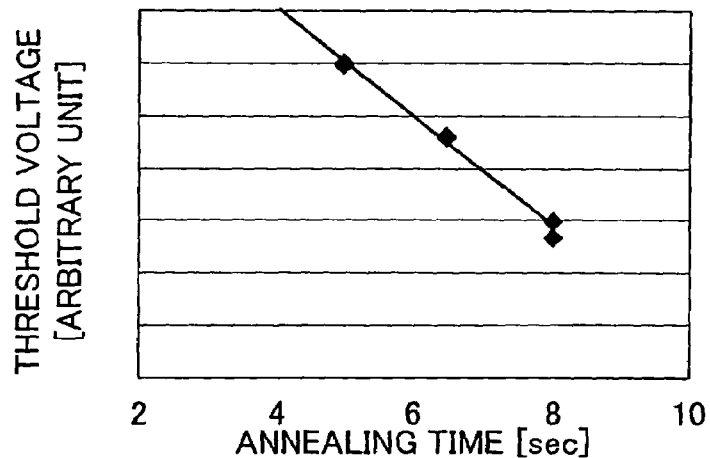
Figure 6C:
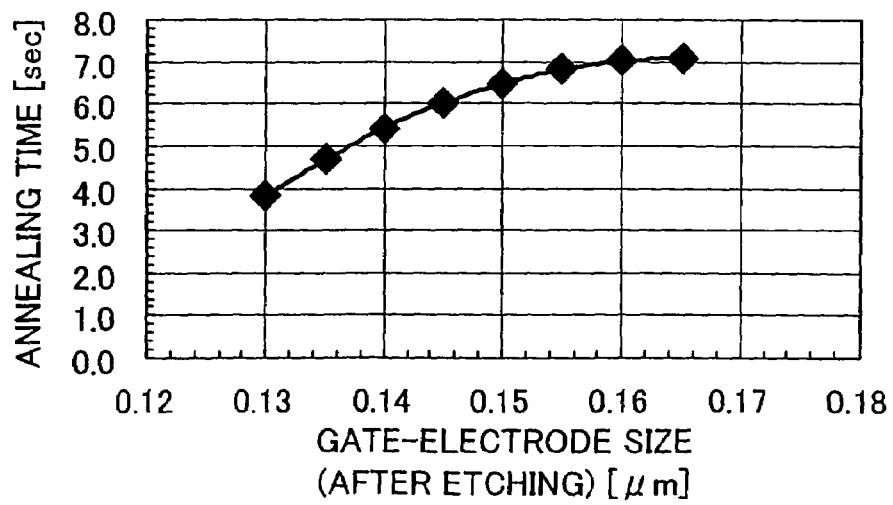

First, a correlation between a gate-electrode size (i.e., the size of a gate electrode formed by etching) and the threshold voltage of a transistor as shown in, for example, FIG. 6A, is measured beforehand. The correlation shown in FIG. 6A is obtained in a case where process conditions such as annealing time are set equal to the standard conditions. In addition, a correlation between the annealing time (i.e., the annealing time in the heat treatment process illustrated in FIG. 5D) and the threshold voltage of a transistor as shown in FIG. 6B is measured beforehand. The correlation shown in FIG. 6B is obtained in a case where a gate electrode having a size of 0.15 µm is formed with the process conditions except for the annealing time set equal to the standard conditions. Thereafter, based on these correlations, a correspondence between the gate-electrode size and the annealing time as shown in FIG. 6C is obtained. This correspondence satisfies that the threshold voltage of the transistor is at a given level (e.g., −0.32V). That is, this correspondence is previously obtained so that a measured size of a gate electrode is reflected in the annealing time after the measurement.

Now, a specific example of a feedforward process of making a measurement result of a gate-electrode size reflected in the annealing temperature, instead of the annealing time, according to this embodiment will be described.

Figure 7A:
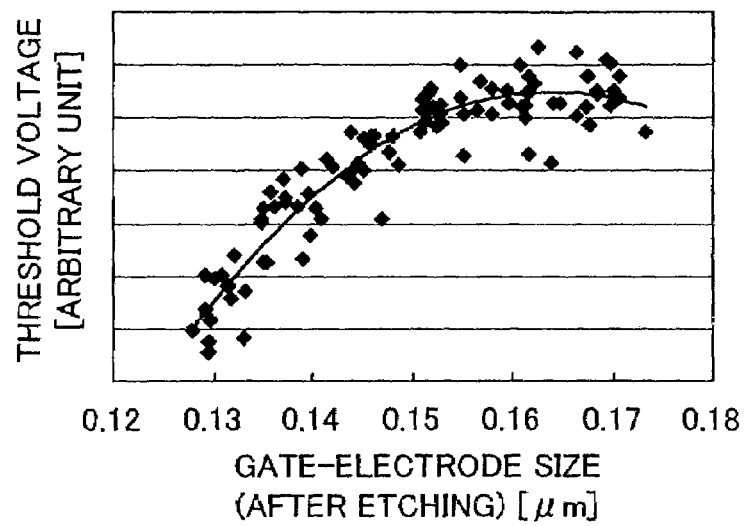
FIGS. 7A through 7C are graphs for explaining a feedforward method of making the measurement result of the gate-electrode size reflected in annealing temperature in the method for fabricating an electronic device of the second or fourth embodiment.
Figure 7B:
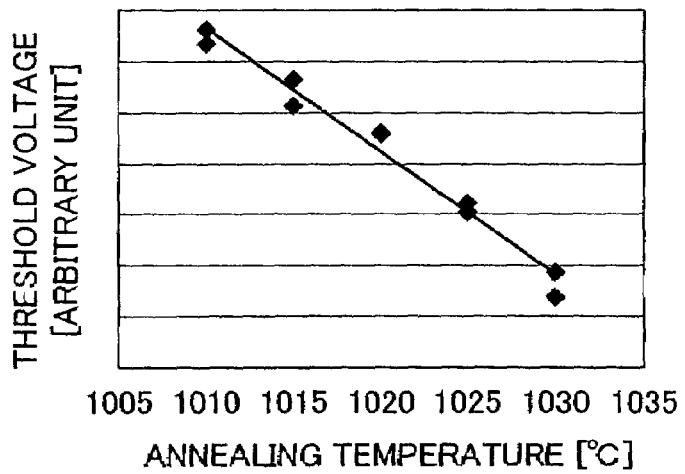
Figure 7C:
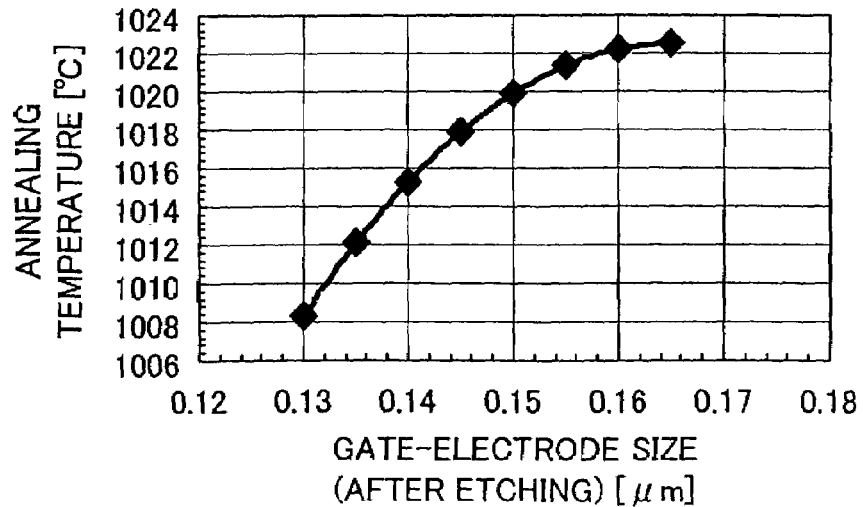

First, a correlation between a gate-electrode size (i.e., the size of a gate electrode formed by etching) and the threshold voltage of a transistor as shown in, for example, FIG. 7A, is measured beforehand. The correlation shown in FIG. 7A is obtained in a case where process conditions such as annealing temperature are set equal to the standard conditions. In addition, a correlation between the annealing temperature (i.e., the annealing temperature in the heat treatment process illustrated in FIG. 5D) and the threshold voltage of a transistor as shown in FIG. 7B is measured beforehand. The correlation shown in FIG. 7B is obtained in a case where a gate electrode having a size of 0.15 µm is formed with the process conditions except for the annealing temperature set equal to the standard conditions. Thereafter, based on these correlations, a correspondence between the gate-electrode size and the annealing temperature as shown in FIG. 7C is obtained. This correspondence satisfies that the threshold voltage of the transistor is at a given level (e.g., −0.32V). That is, this correspondence is previously obtained so that a measured size of a gate electrode is reflected in the annealing temperature after the measurement.

Embodiment 3

Hereinafter, a method for fabricating an electronic device according to a third embodiment of the present invention will be described with reference to the drawings. In this embodiment, a feedforward technique (i.e., a technique of making the measurement result of a gate-electrode size reflected in process conditions) in a case where the gate-electrode size varies, specifically in a case where the size of a gate electrode formed by etching polysilicon is larger than a design value, will be described, using the process steps illustrated in FIGS. 3A through 3E as reference processes. Specifically, in this embodiment, it is assumed that the design value of the gate-electrode size is 0.15 µm and the processed size of the gate electrode is larger than the design value by 10%, i.e., is 0.165 µm.

Figure 8A:
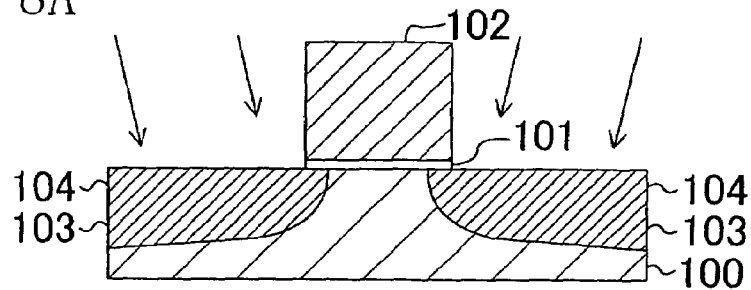
FIGS. 8A through 8D are cross-sectional views illustrating respective process steps of a method for fabricating an electronic device according to the third embodiment.
Figure 8B:
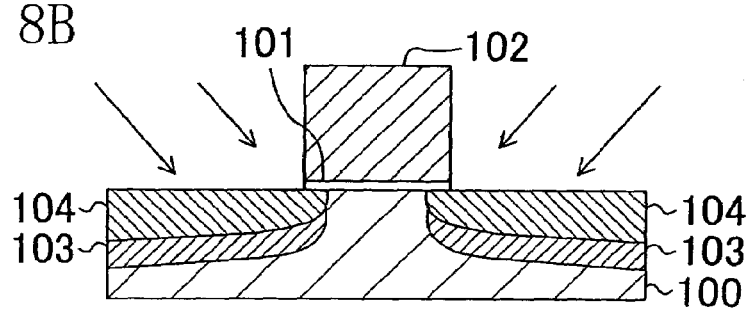
Figure 8C:
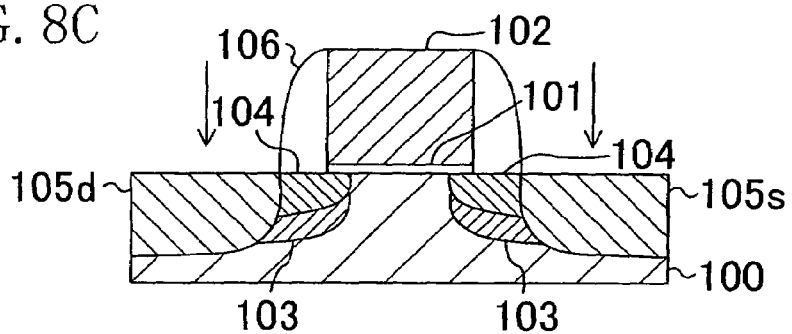
Figure 8D:
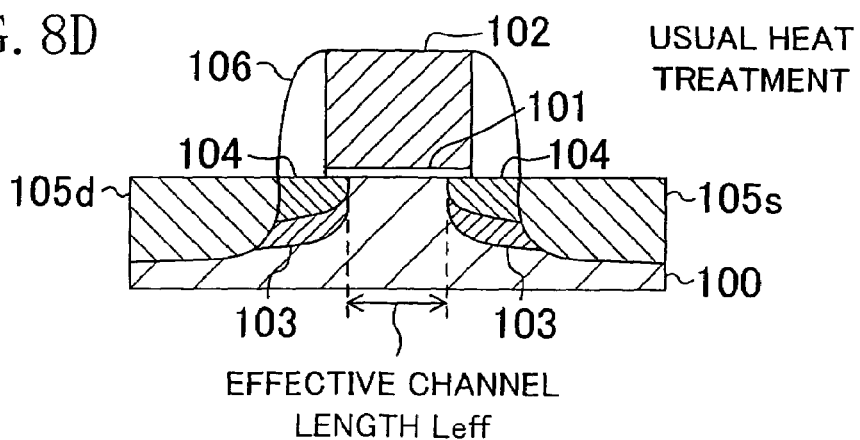

FIGS. 8A and 8D are cross-sectional views illustrating process steps of a method for fabricating an electronic device according to this embodiment.

First, as illustrated in FIG. 8A, a gate oxide film 101 is formed on a p-type silicon substrate 100. Then, a gate electrode 102 made of, for example, polysilicon is formed on the gate oxide film 101 using a known lithography process and a known etching process. Thereafter, the size (i.e., the gate length) of the gate electrode 102 is measured with an SEM. In this case, the measured value of the gate-electrode size is 0.165 µm, whereas the design value of the gate-electrode size is 0.15 µm. Subsequently, ions of, for example, boron are implanted in the silicon substrate 100 using the gate electrode 102 as a mask, thereby forming p-type pocket regions 103. In this case, boron is implanted at an angle of, for example, 7 degrees.

Next, as illustrated in FIG. 8B, ions of, for example, arsenic are implanted in the silicon substrate 100 using the gate electrode 102 as a mask, thereby forming n-type drain extension regions 104 on the pocket regions 103. In this case, arsenic is implanted at an angle of, for example, 12 degrees with an energy of, for example, 6 keV at a dose of, for example, $5\times10^{14}$ atoms/cm$^2$. That is, in this embodiment, since the processed size of the gate electrode 102 is larger than the design value, the angle of implanting arsenic is changed from 7 degrees, which is the standard condition of the reference processes, to 12 degrees. In this embodiment, conditions of this ion implantation are set in the following manner. That is, a correspondence between the size of the gate electrode 102 and ion implantation conditions is obtained beforehand. This correspondence satisfies that the resultant transistor has a given threshold voltage (or a given effective channel length Leff, i.e., the distance between the drain extension regions 104 sandwiching a channel region under the gate electrode 102, determining the threshold voltage). Then, ion implantation conditions are set based on this correspondence and the measured size of the gate electrode 102.

Then, as illustrated in FIG. 8C, sidewalls 106 made of, for example, a silicon oxide film are formed on the sides of the gate electrode 102. Thereafter, ions of, for example, arsenic are implanted in the silicon substrate 100 using the gate electrode 102 and the sidewalls 106 as masks, thereby forming source/drain regions 105 (i.e., a source region 105s and a drain region 105d). In this case, arsenic is implanted at an angle of, for example, zero degrees (with no tilt) with an energy of, for example, 50 keV at a dose of, for example, $5\times10^{15}$ atoms/cm$^2$. That is, conditions of the ion implantation for forming the source/drain regions 105 are the same as the standard conditions of the reference processes for forming an n-transistor described above. In this manner, a structure in which the stack of the pocket regions 103 and the drain extension regions 104 is interposed between the channel region under the gate electrode 102 and the source/drain regions 105 is formed.

Lastly, as illustrated in FIG. 8D, heat treatment is performed so as to diffuse and activate the impurities implanted in the drain extension regions 104 and the source/drain regions 105. In this case, the heat treatment is performed at a temperature of, for example, 1020° C. for, for example, 6.5 seconds. That is, in this embodiment, conditions of this heat treatment are the same as the standard conditions of the reference processes for forming an n-transistor described above. In this manner, an nMOS transistor is formed.

In this embodiment, in view of the fact that the processed size of the gate electrode 102 is larger than the design value, the angle of the ion implantation for forming the drain extension regions 104 is set larger than the standard condition. This makes the drain extension regions 104 expand under the gate electrode 102 to a large degree, so that the effective channel length Leff of the transistor approaches the design value. Accordingly, variation of threshold voltages of transistors is suppressed. In other words, transistors having a desired threshold voltage are obtained.

In this embodiment, the angle of the ion implantation for forming the extension is controlled. Alternatively, the "ion implantation energy" or the "ion implantation amount (dose)" for forming the extension may be adjusted. That is, in this case, it is also possible to suppress expansion of the impurity implanted in the drain extension regions 104 toward the channel region, so that the effective channel length Leff is controlled. Specifically, if the gate-electrode size is smaller than the design value, the ion implantation energy for forming the extension is set lower than the standard condition, whereas if the gate-electrode size is larger than the design value, the ion implantation energy for forming the extension is set higher than the standard condition. In the same manner, if the gate-electrode size is smaller than the design value, the implantation dose for forming the extension is set smaller than the standard condition, whereas if the gate-electrode size is larger than the design value, the implantation dose for forming the extension is set larger than the standard condition.

In this embodiment, with respect to variation of the gate-electrode size, two or more of the "implantation angle", the "implantation energy" and the "implantation dose" for forming the extension may be adjusted. With respect to variation of the gate-electrode size, instead of the adjustment of conditions of the ion implantation for forming the extension, or in addition to the adjustment, conditions (e.g., temperature and time) of heat treatment (i.e., the process step illustrated in FIG. 8D) for forming the extension may be adjusted. In such a case, the heat treatment conditions are set in the following manner. That is, a correspondence between the size of the gate electrode 102 and heat treatment conditions is obtained beforehand. This correspondence satisfies that the resultant transistor has a given threshold voltage (or a given effective channel length Leff, i.e., the distance between the drain extension regions 104 sandwiching a channel region under the gate electrode 102, determining the threshold voltage). Then, heat treatment conditions are set based on this correspondence and the measured size of the gate electrode 102.

In this embodiment, in measuring the size of the gate electrode 102, the size of the gate electrode 102 made of a polysilicon film actually patterned by etching is measured with an SEM. Alternatively, the size of a gate-electrode resist pattern (or a gate-electrode hard mask formed using the resist pattern) formed by lithography before an etching process for processing the gate electrode may be measured as the size of the gate electrode.

Embodiment 4

Hereinafter, a method for fabricating an electronic device according to a fourth embodiment of the present invention will be described with reference to the drawings. In this embodiment, a feedforward technique (i.e., a technique of making a measurement result of a gate-electrode size reflected in process conditions) in a case where the gate-electrode size varies, specifically in a case where the size of a gate electrode formed by etching polysilicon is larger than a design value, will be described, using the process steps illustrated in FIGS. 3A through 3E as reference processes. Specifically, in this embodiment, it is assumed that the design value of the gate-electrode size is 0.15 µm and the processed size of the gate electrode is larger than the design value by 10%, i.e., is 0.165 µm.

Figure 9A:
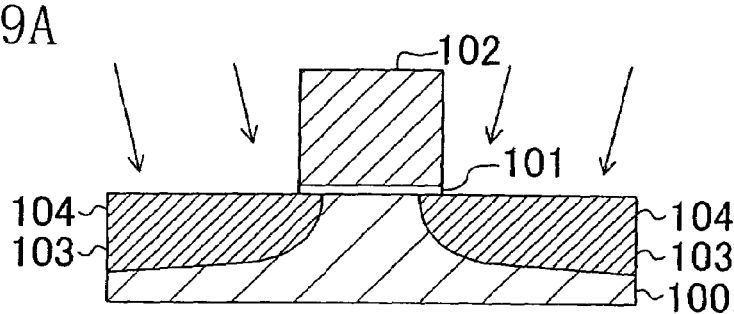

FIGS. 9A and 9D are cross-sectional views illustrating process steps of a method for fabricating an electronic device according to this embodiment.

First, as illustrated in FIG. 9A, a gate oxide film 101 is formed on an n-type silicon substrate 100. Then, a gate electrode 102 made of, for example, polysilicon is formed on the gate oxide film 101 using a known lithography process and a known etching process. Thereafter, the size (i.e., the gate length) of the gate electrode 102 is measured with an SEM. In this case, the measured value of the gate-electrode size is 0.165 µm, whereas the design value of the gate-electrode size is 0.15 µm. Subsequently, ions of, for example, arsenic are implanted in the silicon substrate 100 using the gate electrode 102 as a mask, thereby forming n-type pocket regions 103. In this case, arsenic is implanted at an angle of, for example, 7 degrees.

Figure 9B:
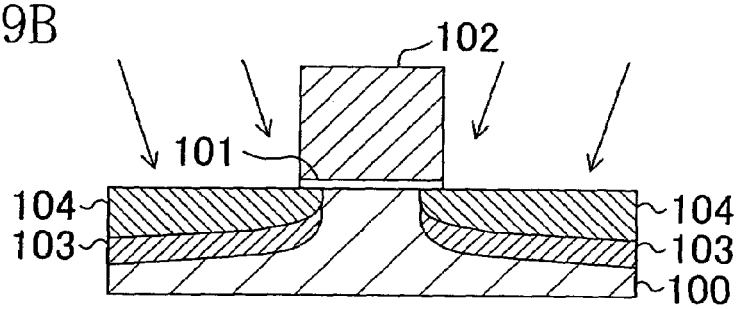

Next, as illustrated in FIG. 9B, ions of, for example, boron are implanted in the silicon substrate 100 using the gate electrode 102 as a mask, thereby forming p-type drain extension regions 104 on the pocket regions 103. In this case, boron is implanted at an angle of, for example, 7 degrees with an energy of, for example, 0.8 keV at a dose of, for example, $5 \times 10^{14}$ atoms/cm². That is, the ion implantation conditions for forming the drain extension regions 104 are the same as the standard conditions of the reference processes for forming a p-transistor described above.

Figure 9C:
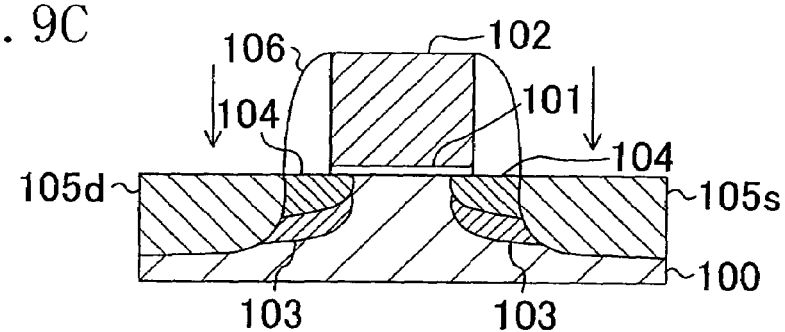
Figure 9C:
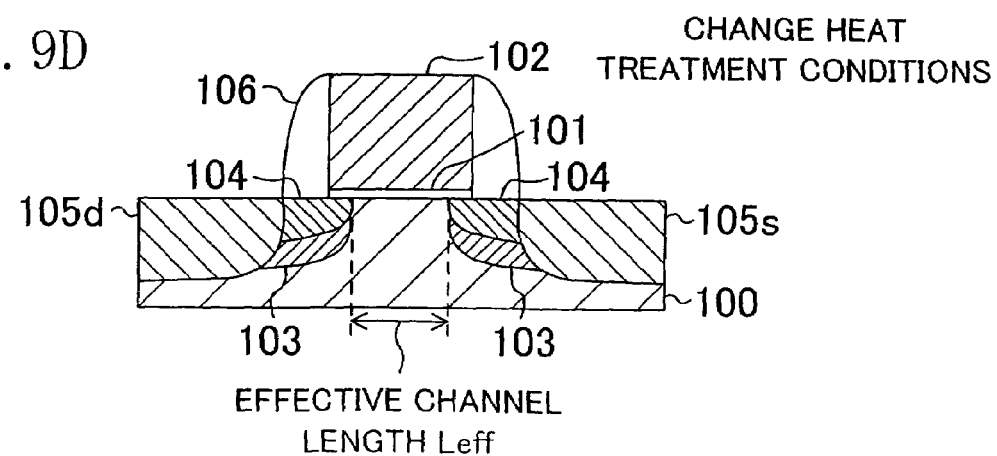

Then, as illustrated in FIG. 9C, sidewalls 106 made of, for example, a silicon oxide film are formed on the sides of the gate electrode 102. Thereafter, ions of, for example, boron are implanted in the silicon substrate 100 using the gate electrode 102 and the sidewalls 106 as masks, thereby forming source/drain regions 105 (i.e., a source region 105s and a drain region 105d). In this case, boron is implanted at an angle of, for example, zero degrees (with no tilt) with an energy of, for example, 5 keV at a dose of, for example, $5 \times 10^{15}$ atoms/cm². That is, conditions of the ion implantation for forming the source/drain regions 105 are the same as the standard conditions of the reference processes for forming a p-transistor described above.

Lastly, as illustrated in FIG. 9D, heat treatment is performed so as to diffuse and activate the impurities implanted in the drain extension regions 104 and the source/drain regions 105. In this case, the heat treatment is performed at a temperature of, for example, 1020° C. for, for example, 7.1 seconds. That is, in this embodiment, since the processed size of the gate electrode 102 is larger than the design value, the heat treatment time is changed from 6.5 seconds, which is the standard condition of the reference processes, to 7.1 seconds. In this manner, a pMOS transistor is formed. In this embodiment, conditions of the heat treatment are set in the following manner. That is, a correspondence between the size of the gate electrode 102 and heat treatment conditions is obtained beforehand. This correspondence satisfies that the transistor has a given threshold voltage (or a given effective channel length Leff, i.e., the distance between the drain extension regions 104 sandwiching a channel region under the gate electrode 102, determining the threshold voltage). Then, ion implantation conditions are set based on this correspondence and the measured size of the gate electrode 102.

In this embodiment, in view of the fact that the processed size of the gate electrode 102 is larger than the design value, the heat treatment time for forming the drain extension regions 104 is set longer than the standard condition. This makes the drain extension regions 104 expand under the gate electrode 102 to a large degree, so that the effective channel length Leff of the transistor approaches the design value. Accordingly, variation of threshold voltages of transistors is suppressed. In other words, transistors having a desired threshold voltage are obtained.

That is, in this embodiment, a feedforward process of making the measurement result of the gate-electrode size reflected in the heat treatment (annealing) time is performed, so that a drain extension structure is accurately formed. Specifically, as an annealing technique for forming a shallow junction, a short-time annealing technique with an annealing time of one minute or less has been conventionally used. Within such a short annealing time, a processed wafer cannot reach a complete thermal equilibrium state, and therefore it is extremely difficult to measure the temperature of the processed wafer. Accordingly, it is difficult to make the measurement result of the gate-electrode size reflected in the annealing temperature. On the other hand, a feedforward process of making the result reflected in the annealing time, which is more easily measured than the annealing temperature, is very effective in implementing the present invention.

In this embodiment, in heat treatment (i.e., the process step illustrated in FIG. 9D) for forming the drain extension structure, annealing apparatus capable of controlling the annealing time with a precision of one second or less is preferably used. Specifically, with cold-wall annealing apparatus typified by lamp annealing apparatus that rapidly heats a wafer by turning on a lamp and rapidly cools the wafer by turning off the lamp, the wafer is not readily cooled because of residual heat remaining on a wall near the wafer after turning off the lamp, so that it is difficult to control the annealing time. On the other hand, with annealing apparatus capable of controlling the annealing time with a precision of one second or less, e.g., hot-wall short-time annealing apparatus, the wafer temperature is rapidly raised by moving the wafer into a wall atmosphere at a temperature higher than a desired temperature and the wafer temperature is rapidly reduced by moving the wafer into a wall atmosphere at a temperature lower than the desired temperature. Accordingly, the annealing time is easily controlled. That is, short-time annealing apparatus is very effective in implementing the present invention.

In this embodiment, the heat treatment time for forming the extension is controlled. Alternatively, the temperature of the heat treatment for forming the extension may be adjusted. That is, in this case, it is also possible to suppress expansion of the impurity implanted in the drain extension regions 104 toward the channel region, so that the effective channel length Leff is controlled. Specifically, in the heat treatment process illustrated in FIG. 9D of this embodiment, for example, the heat treatment time is set at 6.5 seconds, which is the standard condition of the reference processes, and the heat treatment temperature is set at 1023° C., which is higher than the standard condition, so that the effective channel length Leff of the transistor approaches the design value. That is, if the gate-electrode size is smaller than the design value, the heat treatment temperature for forming the extension is set lower than the standard condition, whereas if the gate-electrode size is larger than the design value, the heat treatment temperature for forming the extension is set higher than the standard condition.

In this embodiment, with respect to variation of the gate-electrode size, both of the "heat treatment time" and the "heat treatment temperature" for forming the extension may be adjusted. With respect to variation of the gate-electrode size, instead of the adjustment of the heat treatment conditions for forming the extension, or in addition to the adjustment, conditions (e.g., implantation angle, implantation energy and implantation dose) of ion implantation (i.e., the process step illustrated in FIG. 9B) for forming the extension may be adjusted. In such a case, the ion implantation conditions are set in the following manner. That is, a correspondence between the size of the gate electrode 102 and ion implantation conditions is obtained beforehand. This correspondence satisfies that the resultant transistor has a given threshold voltage (or a given effective channel length Leff, i.e., the distance between the drain extension regions 104 sandwiching a channel region under the gate electrode 102, determining the threshold voltage). Then, ion implantation conditions are set based on this correspondence and the measured size of the gate electrode 102.

In this embodiment, in measuring the size of the gate electrode 102, the size of the gate electrode 102 made of a polysilicon film actually patterned by etching is measured with an SEM. Alternatively, the size of a gate-electrode resist pattern (or a gate-electrode hard mask formed using the resist pattern) formed by lithography before an etching process for processing the gate electrode may be measured as the size of the gate electrode.

Hereinafter, a specific example of a feedforward process of making a measurement result of a gate-electrode size reflected in the annealing time according to this embodiment will be described.

First, a correlation between a gate-electrode size (i.e., the size of a gate electrode formed by etching) and the threshold voltage of a transistor as shown in, for example, FIG. 6A, is measured beforehand. The correlation shown in FIG. 6A is obtained in a case where process conditions such as annealing time are set equal to the standard conditions. In addition, a correlation between the annealing time (i.e., the annealing time in the heat treatment process illustrated in FIG. 9D) and the threshold voltage of a transistor as shown in FIG. 6B is measured beforehand. The correlation shown in FIG. 6B is obtained in a case where a gate electrode having a size of 0.15 μm is formed with the process conditions except for the annealing time set equal to the standard conditions. Thereafter, based on these correlations, a correspondence between the gate-electrode size and the annealing time as shown in FIG. 6C is obtained. This correspondence satisfies that the threshold voltage of the transistor is at a given level (e.g., −0.32V). That is, this correspondence is previously obtained so that a measured size of a gate electrode is reflected in the annealing time after the measurement.

Now, a specific example of a feedforward process of making a measurement result of a gate-electrode size reflected in the annealing temperature, instead of the annealing time, according to this embodiment will be described.

First, a correlation between a gate-electrode size (i.e., the size of a gate electrode formed by etching) and the threshold voltage of a transistor as shown in, for example, FIG. 7A, is measured beforehand. The correlation shown in FIG. 7A is obtained in a case where process conditions such as annealing temperature are set equal to the standard conditions. In addition, a correlation between the annealing temperature (i.e., the annealing temperature in the heat treatment process illustrated in FIG. 9D) and the threshold voltage of a transistor as shown in FIG. 7B is measured beforehand. The correlation shown in FIG. 7B is obtained in a case where a gate electrode having a size of 0.15 μm is formed with the process conditions except for the annealing temperature set equal to the standard conditions. Thereafter, based on these correlations, a correspondence between the gate-electrode size and the annealing temperature as shown in FIG. 7C is obtained. This correspondence satisfies that the threshold voltage of the transistor is at a given level (e.g., −0.32V). That is, this correspondence is previously obtained so that a measured size of a gate electrode is reflected in the annealing temperature after the measurement.

Embodiment 5

In the first and third embodiments, in forming an extension structure for an nMOS transistor, conditions of ion implantation for forming the extension structure are adjusted so as to suppress variation of the threshold voltage. In the second and fourth embodiments, in forming an extension structure for a pMOS transistor, conditions (e.g., temperature and time) of heat treatment for forming the extension structure are adjusted so as to suppress variation of the threshold voltage. In forming the extension structure of the n-transistor, conditions of heat treatment for forming the extension structure may also be adjusted so as to suppress variation of the threshold voltage. In forming the extension structure of the p-transistor, conditions of ion implantation for forming the extension structure may also be adjusted so as to suppress variation of the threshold voltage.

An n-type impurity (e.g., arsenic) is less affected by heat treatment, as compared to a p-type impurity (e.g., boron). In other words, a p-type impurity is more readily diffused by heat treatment than an n-type impurity. Accordingly, in fabrication of an electronic device such as a semiconductor integrated circuit device including an n-transistor and a p-transistor, it is preferable that the sizes of gate electrodes are measured, deviations of the measured sizes from a design value are evaluated and then a feedforward process as in the first and third embodiments is performed on ion implantation conditions for the n-transistor, whereas a feedforward process as in the second and fourth embodiments is performed on heat treatment conditions for the p-transistor. For example, if the sizes of the gate electrodes of the n- and p-transistors are smaller than a design value, the angle of ion implantation is set larger than the standard condition of the reference processes in the formation of the extension structure of the n-transistor, whereas the heat treatment time is set longer than the standard condition of the reference processes in the formation of the extension structure of the p-transistor. In this case, if this heat treatment is performed at a temperature at which an n-type impurity implanted to form the extension structure of the n-transistor is not readily diffused, the extension structure of the n-transistor is determined only by ion implantation conditions.

A method for fabricating an electronic device according to a fifth embodiment of the present invention is based on the foregoing findings and specifically is a method for fabricating an electronic device including an n-transistor and a p-transistor respectively having drain extension regions.

Hereinafter, a method for fabricating an electronic device according to this embodiment will be described with reference to a flowchart shown in FIG. 10.

First, at step S1, gate electrodes of an n-transistor and a p-transistor are formed (see, for example, the process step illustrated in FIG. 4A of the first embodiment and the process step illustrated in FIG. 5A of the second embodiment).

Next, at step S2, the sizes of the gate electrodes of the n- and p-transistors are measured with, for example, an SEM. In this manner, deviations of the sizes of the gate electrodes from a design value are measured.

Then, at step S3, ion implantation for forming a drain extension structure of the n-transistor is performed (see, for example, the process step illustrated in FIG. 4B of the first embodiment and the process step illustrated in FIG. 8B of the third embodiment). At this time, in this embodiment, conditions of this ion implantation for forming the drain extension structure of the n-transistor are set in the following manner. That is, a correspondence between the gate-electrode size of the n-transistor and ion implantation conditions for forming the drain extension structure of the n-transistor is obtained beforehand. This correspondence satisfies that the n-transistor has a given threshold voltage (or a given effective channel length Leff defining this threshold voltage). Based on this correspondence and the measured size of the gate electrode of the n-transistor, ion implantation conditions for forming the drain extension structure of the n-transistor are set. Specifically, the measurement result of the gate electrode of the n-transistor is reflected in conditions of the ion implantation for forming the drain extension structure of the n-transistor so that conditions such as implantation energy, implantation angle or implantation dose are modified from the standard conditions.

Thereafter, at step S4, ion implantation for forming a drain extension structure of the p-transistor is performed (see, for example, the process step illustrated in FIG. 5B of the second embodiment and the process step illustrated in FIG. 9B of the fourth embodiment). At this time, conditions of this ion implantation are the same as the standard conditions.

Subsequently, at step S5, insulating sidewalls are formed on the sides of the gate electrodes of the n- and p-transistors (see, for example, the process step illustrated in FIG. 4C of the first embodiment and the process step illustrated in FIG. 5C of the second embodiment). Thereafter, at step S6, ion implantation for forming source/drain regions of the n-transistor is performed (see, for example, the process step illustrated in FIG. 4C of the first embodiment and the process step illustrated in FIG. 8C of the third embodiment). Then, at step S7, ion implantation for forming source/drain regions of the p-transistor is performed (see, for example, the process step illustrated, in FIG. 5C of the second embodiment and the process step illustrated in FIG. 9C of the fourth embodiment). Conditions of the ion implantations in steps S6, and S7 are the same as the standard conditions.

Then, at step S8, heat treatment (annealing) is performed so as to diffuse and activate impurities implanted in the drain extension regions and the source/drain regions of the n- and p-transistors. In this manner, formation of the n-transistor and the p-transistor is completed. In this embodiment, a correspondence between the gate-electrode size of the p-transistor and heat treatment conditions for forming the drain extension structure of the p-transistor is obtained beforehand. This correspondence satisfies that the p-transistor has a given threshold voltage (or a given effective channel length Leff determining this threshold voltage). Then, based on this correspondence and the measured size of the gate electrode of the p-transistor, heat treatment conditions for forming the drain extension structure of the p-transistor are set. That is, the measurement result of the gate electrode of the p-transistor is reflected in heat treatment conditions for forming the drain extension structure of the p-transistor so that conditions such as the heat treatment time or the heat treatment temperature are modified from the standard conditions.

Then, at step S9, a wiring layer is formed on the n- and p-transistors.

In this embodiment, in addition to the advantages obtained in the first through fourth embodiment, an advantage in which characteristics of the respective n- and p-transistors provided in the same semiconductor integrated circuit device are individually adjusted is obtained. Specifically, in fabrication of an electronic device including an n-transistor and a p-transistor, characteristics of the respective transistors are stabilized, irrespective of variation of gate-electrode sizes.

In the measurement of the size of the gate electrode 102 at step S2 of this embodiment, the size of the gate electrode 102 formed by etching is measured with an SEM. Alternatively, the size of a gate-electrode resist pattern (or a gate-electrode hard mask formed using the resist pattern) formed by lithography before an etching process for processing the gate electrode may be measured as the size of the gate electrode. In such a case, the measurement is performed before the formation of the gate electrode at step S1.

In the annealing process at step S8 of this embodiment, the measurement result of the gate-electrode size of the p-transistor is reflected in the heat treatment (annealing) time, so that the drain extension structure of the p-transistor is accurately formed. Specifically, as an annealing technique for forming a shallow junction, a short-time annealing technique with an annealing time of one minute or less has been conventionally used. Within such a short annealing time, a processed wafer cannot reach a complete thermal equilibrium state, and therefore it is extremely difficult to measure the temperature of the processed wafer. Accordingly, it is difficult to make the measurement result of the gate-electrode size reflected in the annealing temperature. On the other hand, a feedforward process of making the result reflected in the annealing time, which is more easily measured than the annealing temperature, is very effective in implementing the present invention. In this case, in the annealing process at step S8, annealing apparatus capable of controlling the annealing time with a precision of one second or less is preferably used. Specifically, with cold-wall annealing apparatus typified by lamp annealing apparatus that rapidly heats a wafer by turning on a lamp and rapidly cools the wafer by turning off the lamp, the wafer is not readily cooled because of residual heat remaining on a wall near the wafer after turning off the lamp, so that it is difficult to control the annealing time. On the other hand, with annealing apparatus capable of controlling the annealing time with a precision of one second or less, e.g., hot-wall short-time annealing apparatus, the wafer temperature is rapidly raised by moving the wafer into a wall atmosphere at a temperature higher than a desired temperature and the wafer temperature is rapidly reduced by moving the wafer into a wall atmosphere at a temperature lower than the desired temperature. Accordingly, the annealing time is easily controlled. That is, short-time annealing apparatus is very effective in implementing the present invention.

In this embodiment, the sequence of performing the ion implantation for forming the drain extension structure of the n-transistor at step S3 and the ion implantation for forming the drain extension structure of the p-transistor at step S4 may be altered. In the same manner, the sequence of performing the ion implantation for forming the source/drain regions of the n-transistor at step S6 and the ion implantation for forming the source/drain regions of the p-transistor at step S7 may also be altered.

What is claimed is:

1. A method for fabricating an electronic device including an n-transistor with a drain extension structure and a p-transistor with a drain extension structure, the method comprising:

previously obtaining a first correspondence between a size of a gate electrode of the n-transistor and ion implantation conditions for forming the drain extension structure of the n-transistor, the first correspondence satisfying that the n-transistor has a given threshold voltage;

previously obtaining a second correspondence between a size of a gate electrode of the p-transistor and heat treatment conditions for forming the drain extension structure of the p-transistor, the second correspondence satisfying that the p-transistor has the given threshold voltage;

forming the gate electrodes of the respective n-transistor and p-transistor;

measuring the sizes of the gate electrodes of the respective n-transistor and p-transistor;

setting ion implantation conditions for forming the drain extension structure of the n-transistor, based on the previously-obtained first correspondence and the measured size of the gate electrode of the n-transistor;

performing first ion implantation for forming the drain extension structure of the n-transistor under the ion implantation conditions that have been set;

performing second ion implantation for forming the drain extension structure of the p-transistor;

setting heat treatment conditions for forming the drain extension structure of the p-transistor, based on the previously-obtained second correspondence and the measured size of the gate electrode of the p-transistor; and performing heat treatment for forming the drain extension structures of the n-transistor and the p-transistor under the heat treatment conditions that have been set, after the steps of performing the first ion implantation and the second ion implantation.

* * * * *